(12) United States Patent
Kasuya

(10) Patent No.: US 11,406,013 B2
(45) Date of Patent: Aug. 2, 2022

(54) RESIN MULTILAYER SUBSTRATE AND ELECTRONIC DEVICE

(71) Applicant: Murata Manufacturing Co., Ltd., Nagaokakyo (JP)

(72) Inventor: Atsushi Kasuya, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 17/083,361

(22) Filed: Oct. 29, 2020

(65) Prior Publication Data

US 2021/0045241 A1    Feb. 11, 2021

Related U.S. Application Data

(63) Continuation of application No. PCT/JP2019/020288, filed on May 22, 2019.

(30) Foreign Application Priority Data

May 28, 2018    (JP) .............................. JP2018-101425

(51) Int. Cl.
*H05K 1/05*    (2006.01)
*H05K 1/11*    (2006.01)
(Continued)

(52) U.S. Cl.
CPC .......... *H05K 1/056* (2013.01); *H05K 1/0278* (2013.01); *H05K 1/111* (2013.01); *H05K 1/119* (2013.01);
(Continued)

(58) Field of Classification Search
CPC .. H05K 1/056; H05K 1/119; H05K 2203/302; H05K 3/0044; H05K 3/0014;
(Continued)

(56) References Cited

U.S. PATENT DOCUMENTS

| | | | | |
|---|---|---|---|---|
| 5,903,440 A | * | 5/1999 | Blazier | ................ H05K 3/0014 361/749 |
| 2007/0034402 A1 | * | 2/2007 | Cheng | .................... H05K 1/028 174/260 |

(Continued)

FOREIGN PATENT DOCUMENTS

| | | |
|---|---|---|
| JP | 2002-171030 A | 6/2002 |
| JP | 2005-116943 A | 4/2005 |

(Continued)

OTHER PUBLICATIONS

Official Communication issued in International Patent Application No. PCT/JP2019/020288, dated Aug. 13, 2019.

(Continued)

*Primary Examiner* — Ishwarbhai B Patel
(74) *Attorney, Agent, or Firm* — Keating & Bennett, LLP

(57) ABSTRACT

A resin multilayer substrate includes a stacked body including a first main surface, a cavity provided in the first main surface, and conductor patterns provided in the stacked body. The stacked body includes insulating substrate layers including resin as a main material that are stacked. The cavity includes a side surface and a bottom surface. At least a portion of a boundary between the side surface and the bottom surface includes conductor patterns continuous with the side surface and the bottom surface.

14 Claims, 14 Drawing Sheets

(51) Int. Cl.
 *H05K 1/18* (2006.01)
 *H05K 1/02* (2006.01)

(52) U.S. Cl.
 CPC .............. *H05K 1/0277* (2013.01); *H05K 1/11* (2013.01); *H05K 1/18* (2013.01); *H05K 2201/0141* (2013.01)

(58) Field of Classification Search
 CPC .... H05K 3/4632; H05K 3/4697; H05K 1/183; H05K 2201/0141; H01L 23/12
 See application file for complete search history.

(56) References Cited

U.S. PATENT DOCUMENTS

| 2007/0277998 A1* | 12/2007 | Suzuki | H05K 3/4691 |
| | | | 174/255 |
| 2009/0032295 A1* | 2/2009 | Okajima | H05K 1/028 |
| | | | 174/260 |
| 2009/0121346 A1* | 5/2009 | Wachtler | H05K 1/147 |
| | | | 257/724 |
| 2010/0193223 A1* | 8/2010 | Bagung | H05K 1/028 |
| | | | 174/254 |
| 2016/0037647 A1 | 2/2016 | Shimizu et al. | |
| 2016/0181181 A1* | 6/2016 | Su | H01L 41/0475 |
| | | | 438/125 |

FOREIGN PATENT DOCUMENTS

| JP | 2005-197354 A | | 7/2005 |
| JP | 2014-036188 A | | 2/2014 |
| JP | 2016-035987 A | | 3/2016 |
| JP | 2016-122728 A | | 7/2016 |
| JP | 2016162977 A | * | 9/2016 |
| JP | 2017-022227 A | | 1/2017 |

OTHER PUBLICATIONS

Official Communication issued in corresponding Japanese Patent Application No. 2020-522122, dated Dec. 14, 2021.

* cited by examiner

RESIN MULTILAYER SUBSTRATE AND ELECTRONIC DEVICE

CROSS REFERENCE TO RELATED APPLICATIONS

This application claims the benefit of priority to Japanese Patent Application No. 2018-101425 filed on May 28, 2018 and is a Continuation Application of PCT Application No. PCT/JP2019/020288 filed on May 22, 2019. The entire contents of each application are hereby incorporated herein by reference.

BACKGROUND OF THE INVENTION

1. Field of the Invention

The present invention relates to a resin multilayer substrate including a stacked body and a cavity provided in a surface of the stacked body, and relates to an electronic device including the resin multilayer substrate.

2. Description of the Related Art

Conventionally, there has been known a multilayer substrate including a stacked body formed by stacking a plurality of insulating substrates and a cavity (recess) formed in a main surface of the stacked body. For example, Japanese Patent Application Laid-Open No. 2005-197354 discloses a multilayer substrate having a structure in which a component is disposed in a cavity formed in a main surface of a stacked body.

In some cases, a plurality of insulating substrate layers including resin as a main material are stacked to form a stacked body. In that case, when the multilayer substrate is deflected or bent by an external force or the like, bending stress is generated. This bending stress may concentrate on a boundary between a side surface and a bottom surface of the cavity, thus causing a crack at the boundary. In particular, when a conductor pattern is disposed at the boundary (when the boundary is an interface between the conductor pattern formed at the bottom surface and the insulating substrate layers), the interface between the insulating substrate layers and the conductor pattern has a weaker bonding strength than the insulating substrate layers, thereby easily causing a crack at the boundary.

SUMMARY OF THE INVENTION

Preferred embodiments of the present invention provide structures in each of which a cavity including a conductor pattern provided at a bottom surface is provided in a stacked body, a resin multilayer substrate capable of reducing or preventing an occurrence of cracks generated due to bending stress at a boundary between a side surface and the bottom surface of the cavity and deformation of the cavity due to the bending stress, and electronic devices each including a resin multilayer substrate according to a preferred embodiment of the present invention.

A resin multilayer substrate according to a preferred embodiment of the present invention includes a stacked body including a first main surface and a plurality of insulating substrate layers that are stacked and including resin as a main material, a cavity disposed on the first main surface and including a side surface and a bottom surface, and a conductor pattern disposed in the stacked body, in which at least a portion of a boundary between the side surface and the bottom surface includes the conductor pattern continuous with the side surface and the bottom surface.

With this configuration, at least a portion of the boundary between the side surface and the bottom surface of the cavity is not a boundary between dissimilar materials of the conductor patterns and the insulating substrate layers, but instead, includes the continuous conductor patterns. Any bending stress generated in the stacked body is reduced or prevented from causing a crack in the cavity. Further, with this configuration, the Young's modulus of the conductor patterns is higher than the Young's modulus of the insulating substrate layers which are resin, and the deformation of the cavity due to the bending stress generated in the stacked body is able to be reduced or prevented.

In a resin multilayer substrate according to a preferred embodiment of the present invention, the stacked body includes a second main surface opposing the first main surface, and a thickness of the stacked body may have a thickness from the bottom surface to the second main surface in a stacking direction of the plurality of insulating substrate layers that is thinner than a thickness of the stacked body from the first main surface to the bottom surface of the stacked body. In this case, the stacked body is easily deformed by the application of an external force, and cracks are likely to occur at the boundary between the side surface and the bottom surface of the cavity. Therefore, the above-described configuration is particularly effective in reducing or preventing the occurrence of cracks in the cavity due to bending stress.

In a resin multilayer substrate according to a preferred embodiment of the present invention, the resin multilayer substrate preferably further includes an interlayer connection conductor disposed in the stacked body, in which the interlayer connection conductor preferably does not overlap the cavity when viewed from the stacking direction of the plurality of insulating substrate layers. This configuration is able to reduce or prevent damage to the interlayer connection conductor due to stress concentration when forming a cavity with a cutting machine.

In a resin multilayer substrate according to a preferred embodiment of the present invention, the conductor pattern preferably includes a first region embedded in the stacked body and a second region at least partially exposed on the bottom surface, and the second region preferably has a thickness that is thicker than about one-half of a thickness of the first region. If the thickness of the second region of the conductor patterns is thin, a mechanical strength of the second region becomes weak, and a crack is likely to occur at the boundary between the side surface and the bottom surface due to the bending stress applied to the stacked body. On the other hand, even when the bending stress occurs in the stacked body, this configuration is able to reduce or prevent the occurrence of a crack at the boundary between the side surface and the bottom surface of the cavity.

In a resin multilayer substrate according to a preferred embodiment of the present invention, the stacked body preferably includes a bent portion, and a portion of a boundary closest to the bent portion preferably includes the conductor pattern continuous with the side surface and the bottom surface. When the stacked body is bent, the closer to the bent portion, the greater the bending stress. Thus, this configuration can more effectively reduce or prevent the occurrence of cracks in the cavity due to the bending stress.

In a resin multilayer substrate according to a preferred embodiment of the present invention, the bottom surface is preferably polygonal when viewed from the stacking direction of the plurality of insulating substrate layers, and the conductor pattern is preferably disposed at least at a corner of the bottom surface when viewed from the stacking direction. This configuration reduces or prevents tearing at a corner of the bottom surface of the cavity on which bending stress is likely to concentrate when the stacked body is twisted, for example.

In a resin multilayer substrate according to a preferred embodiment of the present invention, the entire or substantially the entire boundary preferably includes the conductor pattern continuous with the side surface and the bottom surface. This configuration can further reduce or prevent the occurrence of cracks in the cavity due to the bending stress as compared with the case where a portion of the boundary between the side surface and the bottom surface of the cavity includes the conductor patterns.

In a resin multilayer substrate according to a preferred embodiment of the present invention, the conductor pattern may be disposed at the bottom surface when viewed from the stacking direction of the plurality of insulating substrate layers.

In a resin multilayer substrate according to a preferred embodiment of the present invention, a component at least partially disposed in the cavity may be provided, and the component may be conductive to the conductor pattern.

In a resin multilayer substrate according to a preferred embodiment of the present invention, the conductor pattern preferably includes a first region embedded in the stacked body and a second region at least partially exposed on the bottom surface, and the second region preferably includes a surface exposed on the bottom surface and having a surface roughness that is smaller than a surface roughness of a surface of the first region. With this configuration, a surface of a portion of the conductor patterns is smoothed, thus increasing a degree of close contact of the surface of a portion of the conductor pattern with the conductive bonding material. Thus, the conductive bonding material and the conductor patterns can be bonded with high bonding strength, and the component is prevented from peeling off from the stacked body.

An electronic device according to a preferred embodiment of the present invention includes a housing and a resin multilayer substrate accommodated in the housing, in which the resin multilayer substrate includes a stacked body including a plurality of insulating substrate layers that are stacked and including resin as a main material, a cavity disposed on a surface of the stacked body and including a side surface and a bottom surface, and a conductor pattern disposed in the stacked body, and at least a portion of a boundary between the side surface and the bottom surface includes the conductor pattern continuous with the side surface and the bottom surface.

With this configuration, at least a portion of the boundary between the side surface and the bottom surface of the cavity is not a boundary between dissimilar materials of the conductor patterns and the insulating substrate layers but includes the continuous conductor patterns. Any bending stress generated in the stacked body would be reduced or prevented from causing a crack in the cavity. Further, with this configuration, the Young's modulus of the conductor patterns is higher than the Young's modulus of the insulating substrate layers which are resin, and the deformation of the cavity due to the bending stress generated in the stacked body is able to be reduced or prevented.

In an electronic component according to a preferred embodiment of the present invention, a component at least partially disposed in the cavity is provided, and the conductor pattern does not have to be conductive with the component. With this configuration, noise generated from the component is shielded by the conductor pattern, and thus an influence of the noise from the component on the resin multilayer substrate is able to be reduced or prevented. Further, with this configuration, because the noise generated from the resin multilayer substrate is shielded by the conductor pattern, the influence of the noise from the resin multilayer substrate on the component is able to be reduced or prevented.

In an electronic component according to a preferred embodiment of the present invention, the entire or substantially the entire conductor pattern is preferably disposed at the bottom surface. This configuration is able to further improve the noise shielding effect as compared with a case where the conductor pattern is provided at a portion of the bottom surface.

In a structure where the cavity including the conductor pattern provided at the bottom surface is provided in the stacked body, preferred embodiments of the present invention are each able to provide a resin multilayer substrate capable of reducing or preventing the occurrence of cracks generated due to the bending stress at the boundary between the side surface and the bottom surface of the cavity and deformation of the cavity due to the bending stress, and electronic devices each including a resin multilayer substrate according to a preferred embodiment of the present invention.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, examples of preferred embodiments of the present invention will be described with reference to the drawings. In each figure, the same or similar elements and portions are designated by the same reference symbols. Although preferred embodiments are shown separately for convenience in consideration of the description of main points or ease of understanding, configurations shown in the different preferred embodiments can be partially replaced or combined. In second and subsequent preferred embodiments, description of matters common to a first preferred embodiment will be omitted, and only different points will be described. In particular, similar advantageous effects obtained by the same or similar configuration will not be sequentially described for each preferred embodiment.

First Preferred Embodiment

Figure 1:
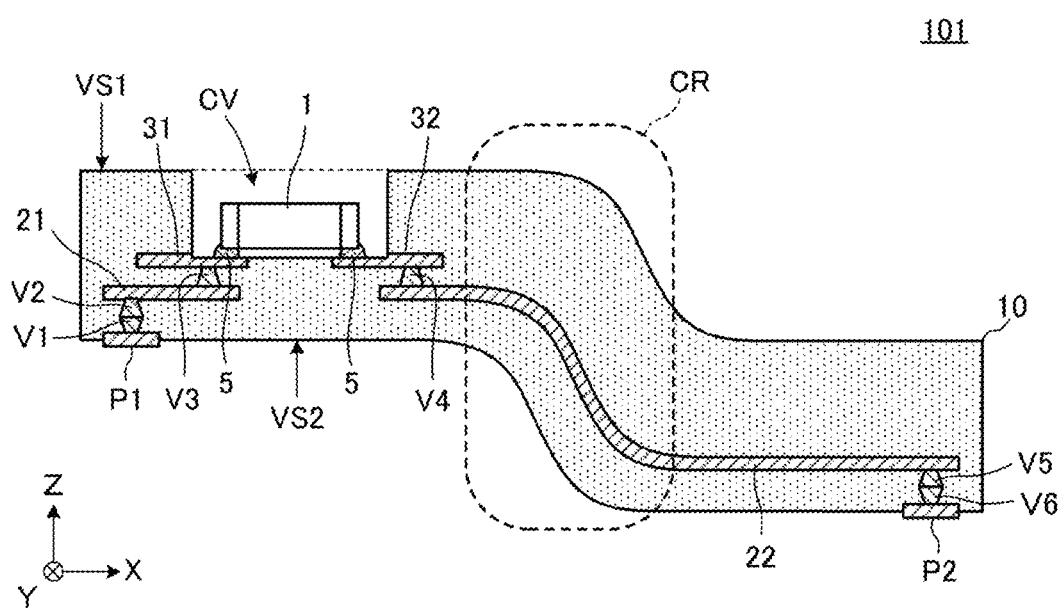
FIG. 1 is a sectional view of a resin multilayer substrate 101 according to a first preferred embodiment of the present invention.
Figure 2A:
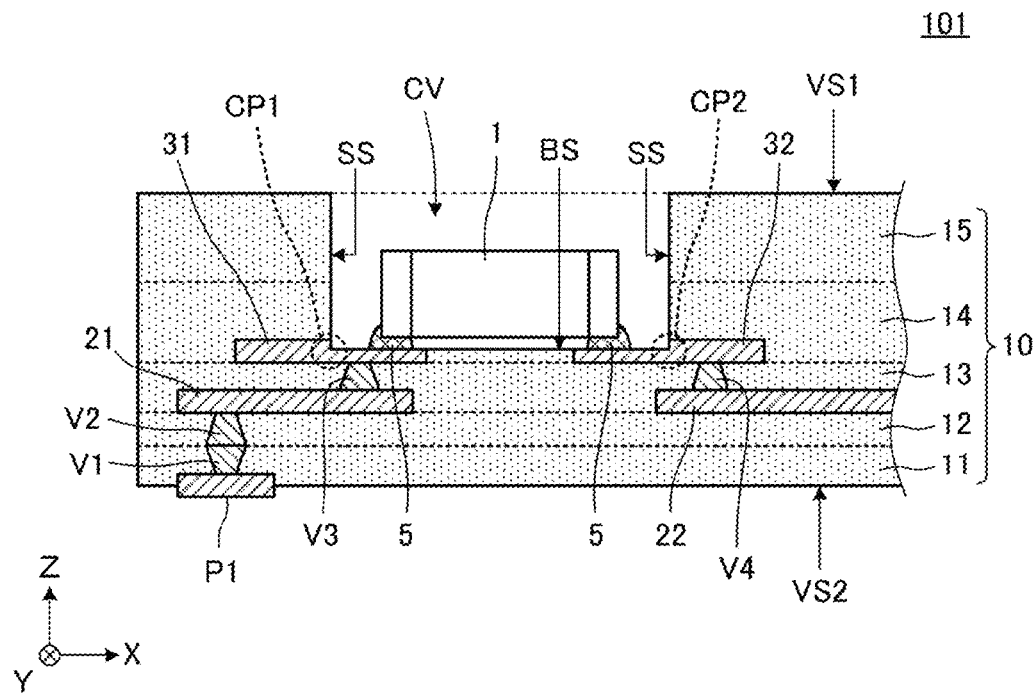
FIG. 2A is an enlarged sectional view of a first end of the resin multilayer substrate 101.
Figure 2B:
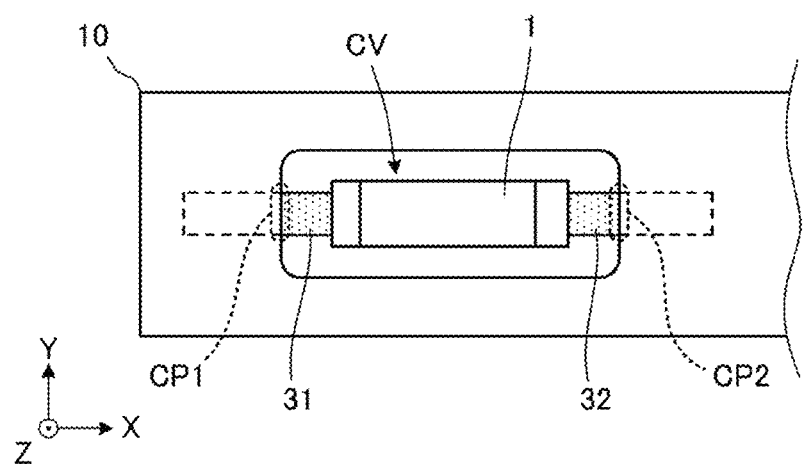
FIG. 2B is an enlarged plan view of the first end of the resin multilayer substrate 101.
Figure 3:
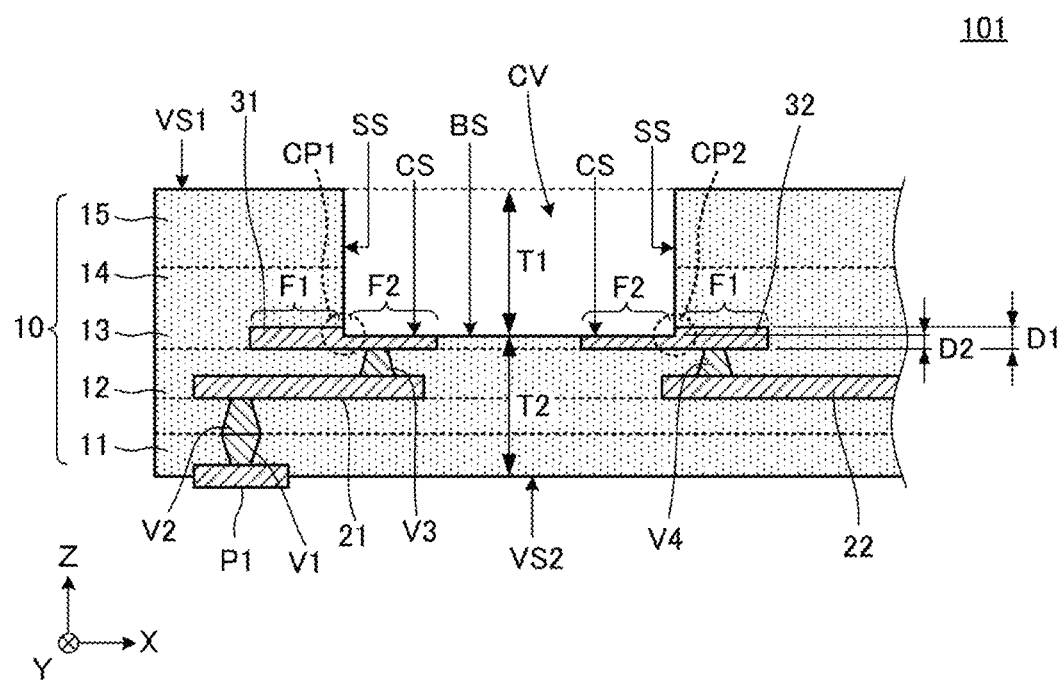
FIG. 3 is an enlarged sectional view of the first end of the resin multilayer substrate 101 before a component is disposed in a cavity CV.

FIG. 1 is a sectional view of a resin multilayer substrate 101 according to a first preferred embodiment of the present invention. FIG. 2A is an enlarged sectional view of a first end of the resin multilayer substrate 101, and FIG. 2B is an enlarged plan view of the first end of the resin multilayer substrate 101. FIG. 3 is an enlarged sectional view of the first end of the resin multilayer substrate 101 before a component is disposed in a cavity CV.

The resin multilayer substrate 101 includes a stacked body 10, a cavity CV, a plurality of conductor patterns 21, 22, 31, and 32, external electrodes P1 and P2, a component 1, and the like.

The stacked body 10 is a bent resin flat plate including a first main surface VS1 and a second main surface VS2 opposing each other. The stacked body 10 includes a bent portion CR. The stacked body 10 is formed by bending a rectangular or substantially rectangular flat plate including a thermoplastic resin such as, for example, a liquid crystal polymer (LCP) as a main material into a crank shape near a center in a longitudinal direction. A shape of the bent stacked body is not limited to the crank shape as shown in FIG. 1, but may be an L-shape or a U-shape, for example.

The stacked body 10 is formed by stacking in order a plurality of insulating substrate layers 11, 12, 13, 14, and 15 including resin as a main material. The insulating substrate layers 11, 12, 13, 14, and 15 are rectangular or substantially rectangular flat plates whose longitudinal directions coincide with each other in an X-axis direction.

The insulating substrate layers 11, 12, 13, 14, and 15 are resin sheets preferably including a thermoplastic resin such as, for example, a liquid crystal polymer (LCP) as a main material.

The cavity CV is a rectangular or substantially rectangular parallelepiped recess extending from the first main surface VS1 toward the second main surface VS2 of the stacked body 10, and includes side surfaces SS and a bottom surface BS. The cavity CV is provided near the first end of the stacked body 10 (a left end of the stacked body 10 shown in FIG. 1). As will be described in detail later, the cavity CV is formed by, for example, grinding and polishing the stacked body 10 (together with a portion of the conductor patterns 31 and 32) from the first main surface VS1 with a cutting machine.

The conductor patterns 21, 22, 31, and 32 and the external electrodes P1 and P2 are provided in the stacked body 10. Specifically, the conductor patterns 21 and 22 are provided inside the stacked body 10. The conductor patterns 31 and 32 are partially exposed on the side surfaces SS and the bottom surface BS of the cavity CV. The external electrodes P1 and P2 are provided on the second main surface VS2 of the stacked body 10. The external electrode P1 is provided near the first end of the stacked body 10. The external electrode P2 is provided near a second end of the stacked body 10 (a right end of the stacked body shown in FIG. 1). A Young's modulus E1 of the conductor patterns 21, 22, 31, and 32 is higher than a Young's modulus E2 of the insulating substrate layers 11, 12, 13, 14, and 15 which are resins (E1>E2). The conductor patterns 21, 22, 31, and 32 and the external electrodes P1 and P2 are conductor patterns such as Cu foil, for example.

As shown in FIG. 3, the conductor patterns 31 and 32 include a first region F1 and a second region F2. The first region F1 is a portion of the conductor patterns 31 and 32 embedded in the stacked body 10. The second region F2 is a portion of the conductor patterns 31 and 32 at least partially exposed on the bottom surface BS of the cavity CV.

The entire or substantially the entire component 1 is disposed in the cavity and mounted on the bottom surface BS of the cavity CV. The component 1 is conductive to the conductor patterns 31 and 32 provided at the bottom surface BS. Specifically, input and output terminals of the component 1 are connected to the conductor patterns 31 and 32 with a conductive bonding material 5 interposed therebetween. The component 1 is preferably, for example, a semiconductor device, a chip component such as a chip inductor or a chip capacitor, a radio frequency integrated circuit (RFIC) element, an impedance matching circuit, or the like. The conductive bonding material 5 is preferably, for example, solder.

The external electrodes P1 and P2 are connected to the input and output terminals of component 1.

Specifically, the external electrode P1 is connected to a first end of the conductor pattern 21 with interlayer connection conductors V1 and V2 interposed therebetween. A second end of the conductor pattern 21 is connected to the conductor pattern 31 with an interlayer connection conductor V3 interposed therebetween. The conductor pattern 31 is connected to one of the input and output terminals of the component 1 with the conductive bonding material 5 interposed therebetween. Further, the external electrode P2 is connected to a first end of the conductor pattern with interlayer connection conductors V5 and V6 interposed therebetween. A second end of the conductor pattern 22 is connected to the conductor pattern 32 with an interlayer connection conductor V4 interposed therebetween. The conductor pattern 32 is connected to the other input and output terminal of the component 1 with the conductive bonding material 5 interposed therebetween.

As shown in FIGS. 2A, 3, and the like, portions of a boundary between the side surfaces SS and the bottom surface BS (parts CP1 and CP2) of the cavity CV include the conductor patterns 31 and 32 continuous with the side surfaces SS and the bottom surface BS. Further, in the present preferred embodiment, a portion (portion CP2) of the boundary between the side surfaces SS and the bottom surface BS closest to the bent portion CR (the boundary on a right side of the cavity CV shown in FIG. 2B) includes the conductor patterns 31 and 32 continuous with the side surfaces SS and the bottom surface BS.

In the present disclosure, a difference between a thickness D1 of the first region F1 of the conductor patterns 31 and 32 and a thickness D2 of the second region F2 of the conductor patterns 31 and 32 is preferably about 5 μm or more, for example. In the present preferred embodiment, the thickness D2 of the second region F2 is thicker than one-half of the thickness D1 of the first region F1 (D2>D1/2). The thickness D1 of the first region F1 is preferably, for example, about 15 μm, and the thickness D2 of the second region F2 is preferably, for example, about 10 μm.

Although not shown, a surface CS of the second region F2 exposed on the bottom surface BS is smoothed. A surface roughness R2 of the surface CS is smaller than a surface roughness R1 of a surface of the first region F1 (R2<R1). For a calculation of the surface roughness, a standard (arithmetic mean roughness) defined in Japanese Industrial Standards (JIS) B0601-2001 is adopted.

Further, a thickness T2 from the bottom surface BS to the second main surface VS2 in a stacking direction (Z-axis direction) of the plurality of insulating substrate layers 11, 12, 13, 14, and 15 of the stacked body 10 is thinner than a thickness T1 from the first main surface VS1 to the bottom surface BS in the Z-axis direction of the stacked body 10 (T2<T1).

The resin multilayer substrate 101 according to the present preferred embodiment achieves the following advantageous effects.

In the present preferred embodiment, portions of the boundary between the side surfaces SS and the bottom surface BS (parts CP1 and CP2) of the cavity CV include the conductor patterns and 32 continuous with the side surfaces SS and the bottom surface BS. In this configuration, at least a portion of the boundary between the side surfaces SS and the bottom surface BS of the cavity CV is not the boundary between the conductor patterns 31 and 32 and the insulating substrate layers, that is, is not an interface between dissimilar materials. Any bending stress generated in the stacked body is reduced or prevented from causing a crack in the cavity. Further, in this configuration, the Young's modulus of the conductor patterns 31 and 32 is higher than the Young's modulus of the resin (insulating substrate layers), and the deformation of the cavity CV due to the bending stress generated in the stacked body 10 can be reduced or prevented.

Further, in the present preferred embodiment, the portion (portion CP2) of the boundary between the side surfaces SS and the bottom surface BS closest to the bent portion CR (the boundary on a right side of the cavity CV shown in FIG. 2B) includes the conductor patterns 31 and 32 continuous with the side surfaces SS and the bottom surface BS. When the stacked body 10 is bent, the closer to the bent part CR, the greater the bending stress. Thus, the above configuration can reduce or prevent the occurrence of cracks in the cavity CV due to the bending stress more effectively. It is also possible to provide a conductor pattern that covers not only the bottom surface of the cavity CV but also the entire or substantially the entire side surfaces by a sputtering method, electrolytic plating, or the like, for example. In that case, a strength against bending stress is further increased.

In the present preferred embodiment, the thickness D2 of the second region F2 of the conductor patterns 31 and 32 is thicker than one-half of the thickness D1 of the first region F1 (D2>D1/2). If the thickness D2 of the second region F2 of the conductor patterns 31 and 32 is thin, a mechanical strength of the second region F2 becomes weak, and a crack is likely to occur at the boundary between the side surfaces SS and the bottom surface BS due to the bending stress applied to the stacked body 10. On the other hand, even when the bending stress occurs in the stacked body 10, this configuration can reduce or prevent the occurrence of a crack at the boundary between the side surfaces SS and the bottom surface BS of the cavity CV.

In the present preferred embodiment, the thickness T2 from the bottom surface BS to the second main surface VS2 in the Z-axis direction of the stacked body 10 is thinner than a thickness T1 from the first main surface VS1 to the bottom surface BS in the Z-axis direction of the stacked body 10 (T2<T1). In this case, the stacked body 10 is easily deformed by the application of an external force, and cracks are likely to occur at the boundary between the side surfaces SS and the bottom surface BS of the cavity CV. Therefore, when the thickness T2 from the bottom surface BS to the second main surface VS2 in the Z-axis direction of the stacked body 10 is thinner than the thickness T1 from the first main surface VS1 to the bottom surface BS in the Z-axis direction of the stacked body 10, the configuration according to the present preferred embodiment is particularly effective in that the occurrence of a crack due to the bending stress is reduced or prevented in the cavity CV.

Further, in the present preferred embodiment, the surface roughness R2 of the surface CS exposed on the bottom surface BS of the second region F2 is smaller than the surface roughness R1 of the surface of the first region F1 (R2<R1). In this configuration, the surface CS of the conductor patterns 31 and 32 is smoothed, and a contact area of the surface CS with the conductive bonding material 5 increases. Thus, the conductive bonding material 5 and the conductor patterns 31 and 32 can be bonded with high bonding strength, and the component 1 is prevented from peeling off from the stacked body 10.

In the present preferred embodiment, an example is shown in which only the surface CS exposed on the bottom surface BS of the second regions F2 of the conductor patterns 31 and 32 is smoothed, but the present invention is not limited to this configuration. Surfaces of the conductor patterns 31 and 32 in contact with the insulating substrate layers (for example, lower surfaces of the conductor patterns 31 and 32 in FIG. 3) may be roughened. In that case, the conductor patterns 31 and 32 can be difficult to peel off from the stacked body 10. When the surfaces of the conductor patterns 31 and 32 are cut with a cutting machine (detailed later), the conductor patterns 31 and 32 easily peel off from the stacked body 10, and the above configuration is particularly effective.

Figure 4:
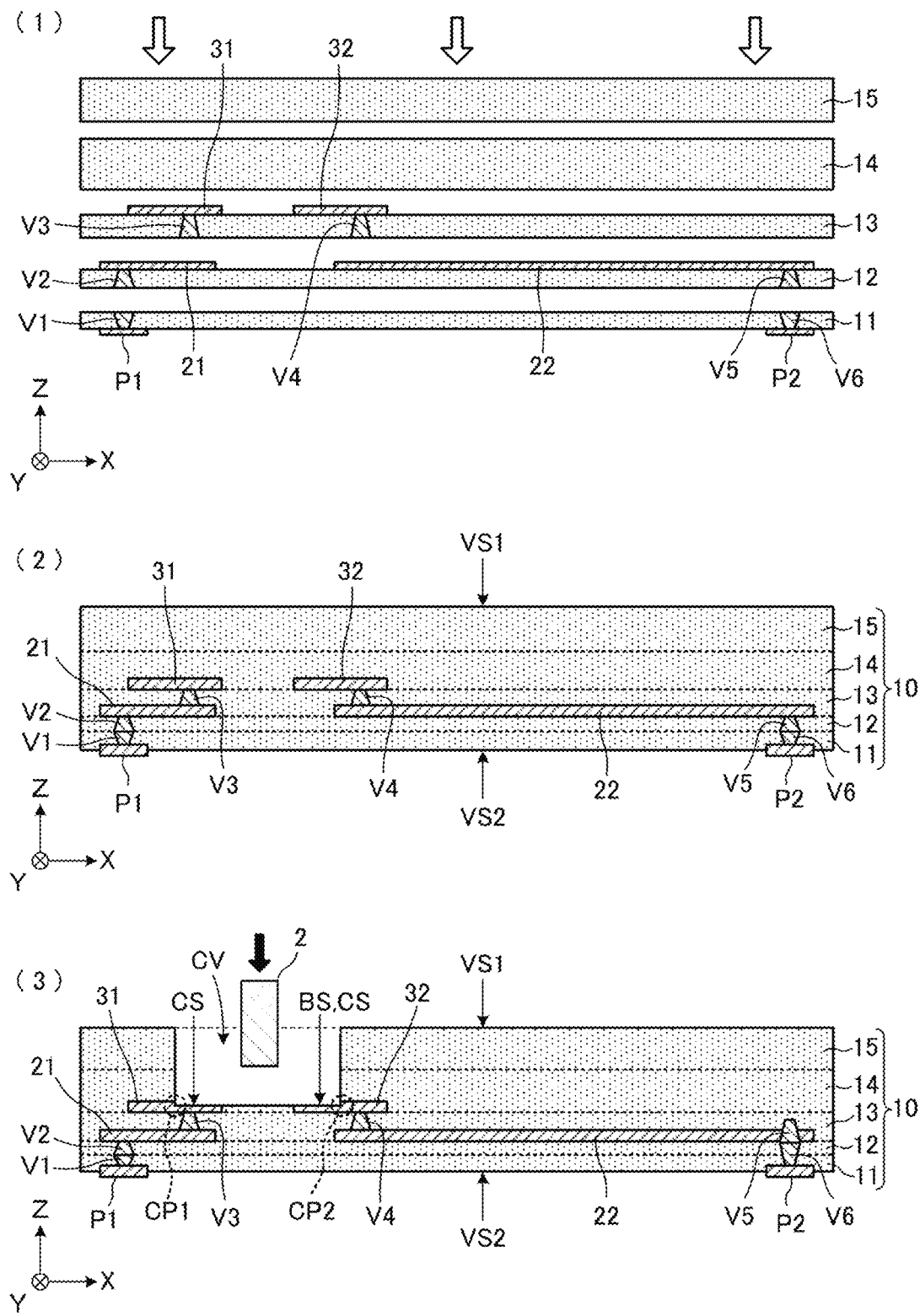
FIG. 4 is a sectional view showing a process of manufacturing the resin multilayer substrate 101 in order.
Figure 5:
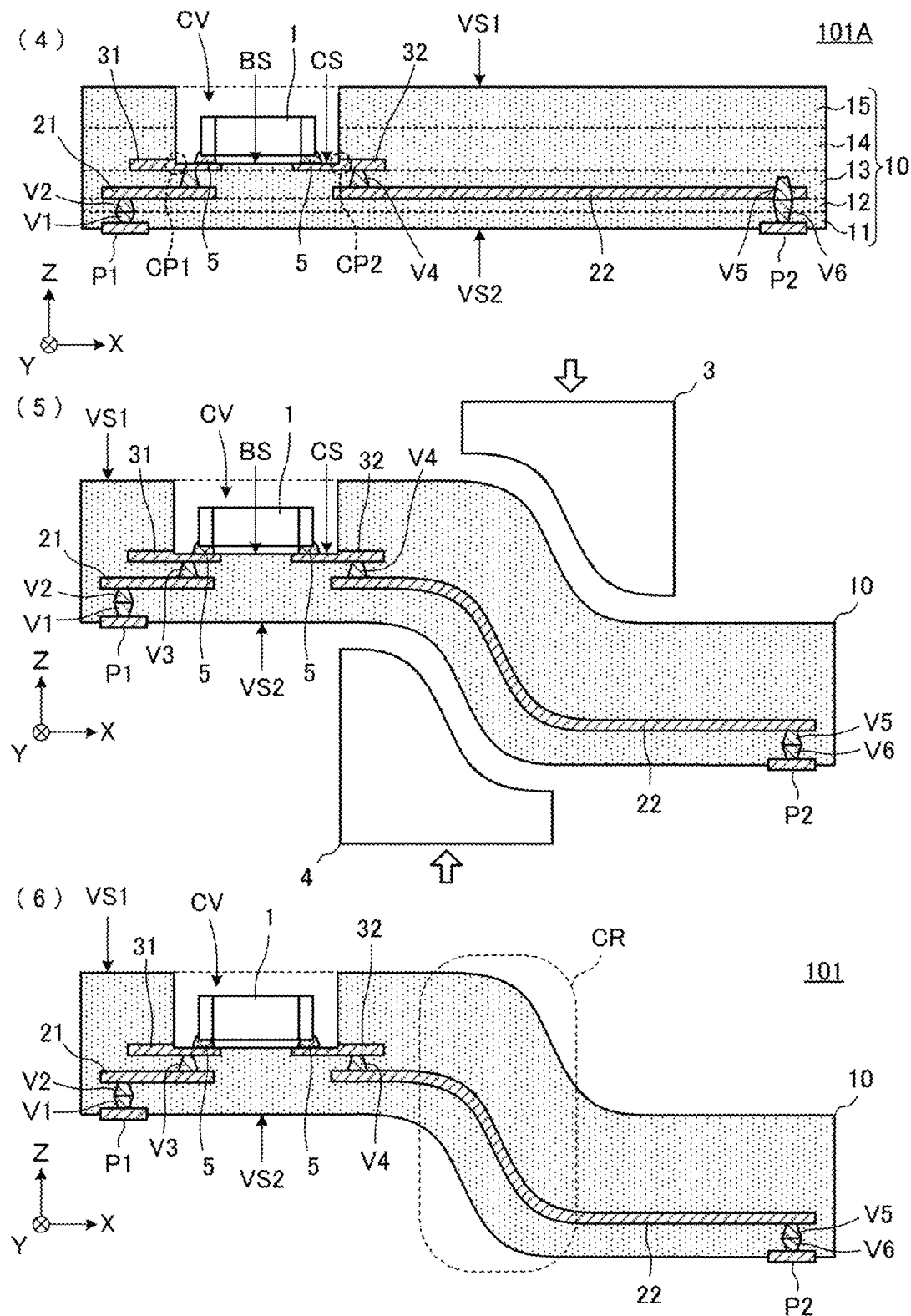
FIG. 5 is a sectional view showing the process of manufacturing the resin multilayer substrate 101 in order.

The resin multilayer substrate 101 according to the present preferred embodiment is manufactured by, for example, the following non-limiting example of a process. FIGS. 4 and 5 are sectional views showing the process of manufacturing the resin multilayer substrate 101 in order. For convenience of explanation, the manufacturing process using one chip (individual piece) will be described in FIG. 4, but the actual manufacturing process of the resin multilayer substrate is performed in a state of a collective board.

First, as shown in (1) in FIG. 4, the plurality of insulating substrate layers 11, 12, 13, 14, and 15 are prepared. The insulating substrate layers 11, 12, 13, 14, and 15 are resin sheets including a thermoplastic resin such as, for example, a liquid crystal polymer (LCP) as a main material.

After that, the conductor patterns 21, 22, 31, and 32, the external electrodes P1 and P2, and the like are formed on the plurality of insulating substrate layers 11, 12, and 13. Specifically, a metal foil (for example, Cu foil) is laminated on one surface of each of the insulating substrate layers 11, 12, and 13, and the metal foil is patterned by photolithography. As a result, the external electrodes P1 and P2 are formed on a reverse surface of the insulating substrate layer 11, the conductor patterns 21 and 22 are formed on a surface of the insulating substrate layer 12, and the conductor patterns 31 and 32 are formed on a surface of the insulating substrate layer 13.

In addition, the interlayer connection conductors V1 and V6 are formed on the insulating substrate layer 11, the interlayer connection conductors V2 and V5 are formed on the insulating substrate layer 12, and the interlayer connection conductors V3 and V4 are formed on the insulating substrate layer 13. The interlayer connection conductors are provided by forming through holes in the insulating substrate layers with a laser or the like, arranging (filling) a conductive paste including metal powder such as Cu, Sn, or an alloy thereof, and then solidifying by heat-pressing.

Next, the insulating substrate layers 11, 12, 13, 14, and 15 are stacked in order, and the plurality of stacked insulating substrate layers 11, 12, 13, 14, and 15 are heat-pressed (collectively pressed) to form the stacked body 10 as shown in (2) in FIG. 4.

Subsequently, as shown in (3) in FIG. 4, the cavity CV is formed in the first main surface VS1 of the stacked body 10 in the state of the collective board. Specifically, the cavity CV is formed by, for example, grinding and polishing the stacked body 10 from the first main surface VS1 with a cutting machine 2. The cutting machine 2 is, for example, a router or a dicer.

Upon formation of the cavity CV, portions of the surfaces of the conductor patterns 31 and 32 are ground and polished in a thickness direction (Z-axis direction) with the cutting machine 2. As a result, the conductor patterns 31 and 32 include the first region embedded in the stacked body 10 and the second region at least partially exposed on the bottom surface BS of the cavity CV. Further, at least a portion (portions CP1 and CP2) of the boundary between the side surfaces SS and the bottom surface BS of the cavity CV includes the conductor patterns 31 and 32 continuous with the side surfaces SS and the bottom surface BS.

In the present invention, a portion of the surfaces of the conductor patterns 31 and 32 is ground and polished by about 5 µm or more, for example.

Further, the surfaces of the conductor patterns 31 and 32, at least partially ground and polished by the cutting machine 2, cause the surface CS exposed on the bottom surface BS in the second region (surfaces of the conductor pattern 31 and 32 ground with the cutting machine 2) to be smoothed. The surface roughness R2 of the surface CS is smaller than the surface roughness R1 of the surface of the first region (R2<R1). Note that a plating film may be formed on the surface CS or surfaces configuring the side surfaces SS of the conductor patterns 31 and 32. When the surfaces of the conductor patterns 31 and 32 are cut, an antioxidant material and the like formed on the surfaces of the conductor patterns 31 and 32 are also cut and polished similarly. Thus, the surfaces of the conductor patterns 31 and 32 can be protected from oxidation and solder erosion by plating.

Next, as shown in (4) in FIG. 5, the component 1 is mounted on the bottom surface BS of the cavity CV. Specifically, the paste conductive bonding material 5 is printed on the conductor patterns 31 and 32, and then the component 1 is mounted by a mounter or the like. After that, the input and output terminals of the component 1 are bonded to the conductor patterns 31 and 32 with the conductive bonding material 5 interposed therebetween by a reflow process, for example.

Subsequently, a resin multilayer substrate 101A is obtained by being separated from the collective board into individual pieces.

Next, as shown in (5) in FIG. 5, the first main surface VS1 and the second main surface VS2 of the stacked body 10 are heated and pressurized in the Z-axis direction using an upper mold 3 and a lower mold 4 (see an arrow shown in (5) in FIG. 5). A position for heating and pressurizing is near the center of the stacked body 10 in the longitudinal direction (X-axis direction). The upper mold 3 and the lower mold 4 have an L-shape in sectional shape.

After the stacked body 10 is cooled and solidified, the stacked body 10 is removed from the upper mold 3 and the lower mold 4, and the resin multilayer substrate 101 holding a bent shape as shown in (6) in FIG. 5 is obtained. In this way, by providing the stacked body 10 whose main material is the thermoplastic resin, the shape can be easily plastically processed in accordance with a mounting state (unevenness of a mounting destination and the like).

Further, in the above-described manufacturing method, the stacked body 10 can be easily formed by collectively pressing the plurality of stacked insulating substrate layers 11 to 15, thus reducing man-hours in the manufacturing process and reducing costs.

In the above-described manufacturing method, by grinding and polishing the stacked body 10 from the first main surface VS1 together with a portion of the conductor patterns 31 and 32 with the cutting machine 2, for example, the cavity CV is formed, and the surface CS of the second region F2 of the conductor patterns 31 and 32 can be easily smoothed.

In the above-described manufacturing method, when the cavity CV is formed by the cutting machine 2, a portion of the surfaces of the conductor patterns 31 and 32 is scraped, and thus a temperature near the second region F2 of the conductor patterns 31 and 32 rises to about 300° C., for example. This heat promotes crystallization of the portion near the second region F2 of the bottom surface BS of the stacked body 10 including a liquid crystal polymer (LCP) as a main material, thus improving heat resistance. This reduces or prevents deformation (deformation due to softening or melting) of the bottom surface BS of the cavity CV during subsequent heating (during the reflow process) and reduces or prevents poor bonding of the component 1 to the stacked body 10.

Second Preferred Embodiment

In a second preferred embodiment of the present invention, an example of a resin multilayer substrate manufactured by a non-limiting example of a manufacturing method different from the method described in the first preferred embodiment is shown.

Figure 6:
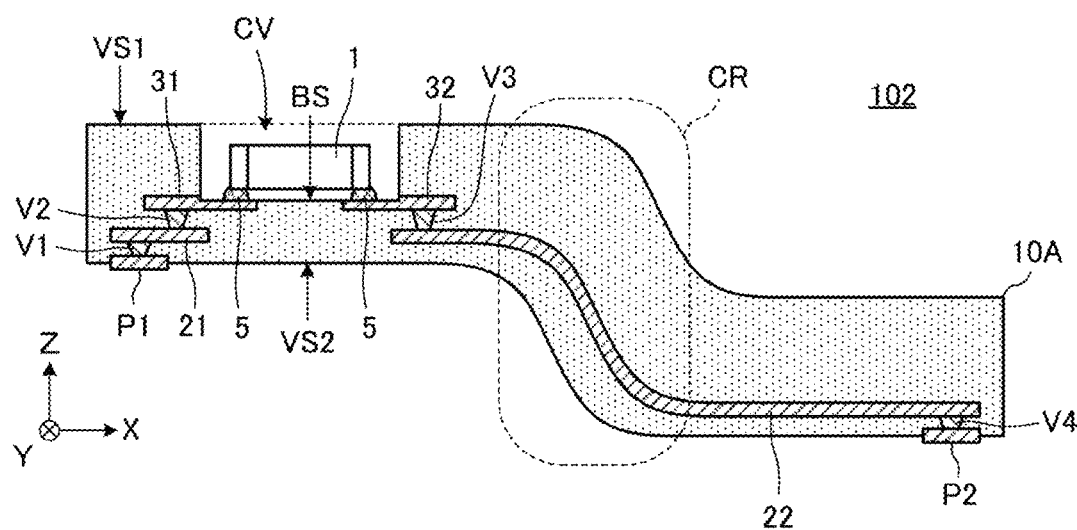
FIG. 6 is a sectional view of a resin multilayer substrate 102 according to a second preferred embodiment of the present invention.
Figure 7A:
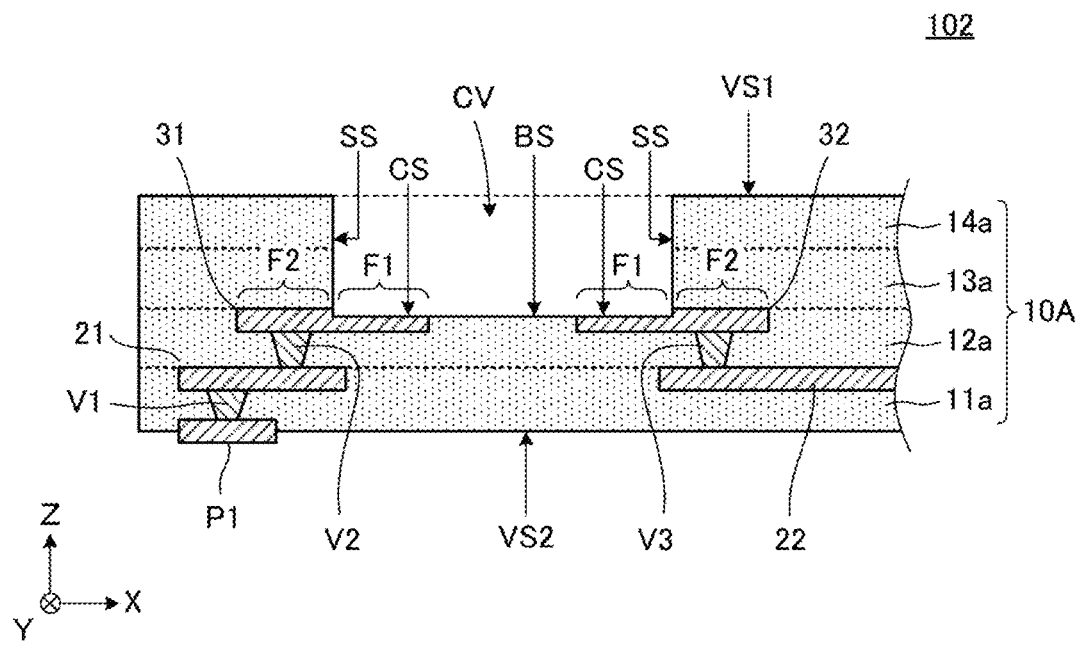
FIG. 7A is an enlarged sectional view showing a first end of the resin multilayer substrate 102.
Figure 7B:
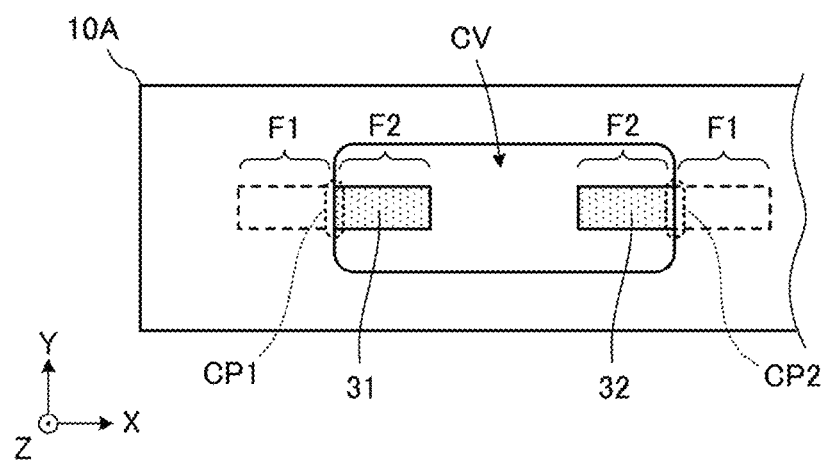
FIG. 7B is an enlarged plan view showing the first end of the resin multilayer substrate 102.

FIG. 6 is a sectional view of a resin multilayer substrate 102 according to the second preferred embodiment. FIG. 7A is an enlarged sectional view showing a first end of the resin multilayer substrate 102, and FIG. 7B is an enlarged plan view showing the first end of the resin multilayer substrate 102. In FIGS. 7A and 7B, the components are not shown for clarity of the structure.

The resin multilayer substrate 102 is different from the resin multilayer substrate 101 according to the first preferred embodiment in that a stacked body 10A is provided. The stacked body 10A is different from the stacked body 10 described in the first preferred embodiment in the number of layers of the insulating substrate layers. Other configurations of the resin multilayer substrate 102 are the same or substantially the same as those of the resin multilayer substrate 101.

Hereinafter, elements and portions different from the resin multilayer substrate 101 according to the first preferred embodiment will be described.

The stacked body 10A is formed by stacking four insulating substrate layers 11a, 12a, 13a, and 14a in order. A configuration of the insulating substrate layers 11a, 12a, 13a, and 14a is the same or substantially the same as that of the insulating substrate layers 11, 12, 13, and 14 described in the first preferred embodiment.

The external electrodes P1 and P2 are connected to the input and output terminals of component 1.

Specifically, the external electrode P1 is connected to the first end of the conductor pattern 21 with the interlayer connection conductor V1 interposed therebetween. The second end of the conductor pattern 21 is connected to a first end of the conductor pattern 31 with the interlayer connection conductor V2 interposed therebetween. A second end of the conductor pattern 31 is connected to one of the input and output terminals of the component 1 with the conductive bonding material 5 interposed therebetween. Further, the external electrode P2 is connected to the first end of the conductor pattern 22 with the interlayer connection conductor V4 interposed therebetween. The second end of the conductor pattern 22 is connected to a first end of the conductor pattern 32 with the interlayer connection conductor V3 interposed therebetween. A second end of the conductor pattern 32 is connected to the other input and output terminal of the component 1 with the conductive bonding material 5 interposed therebetween.

As shown in FIG. 7A and the like, the interlayer connection conductors V1, V2, V3, and V4 are disposed at positions that do not overlap the cavity CV when viewed from the Z-axis direction.

The resin multilayer substrate 102 according to the present preferred embodiment obtains the following advantageous effects in addition to the advantageous effects described in the first preferred embodiment.

In the present preferred embodiment, the interlayer connection conductors V1, V2, V3, and V4 are disposed at positions that do not overlap the cavity CV when viewed from the Z-axis direction. This configuration can reduce or prevent damage to the interlayer connection conductor due to stress concentration when the cavity CV is formed by the cutting machine.

Further, according to the present preferred embodiment, as will be described in detail later, a thin film of the insulating substrate layer (refer to a thin film of the insulating substrate layer 14 located on the bottom surface BS in FIG. 3) is unlikely to remain on the bottom surface BS of the cavity CV after the cavity CV is formed by the cutting machine.

Therefore, compared with a case where the thin film of the insulating substrate layer remains on the bottom surface BS of the cavity CV, the interface between the insulating substrate layers is unlikely to peel off on the bottom surface BS of the cavity CV when the cavity is formed by a cutting machine or when bending stress occurs in the stacked body due to an external force or the like.

Figure 8:
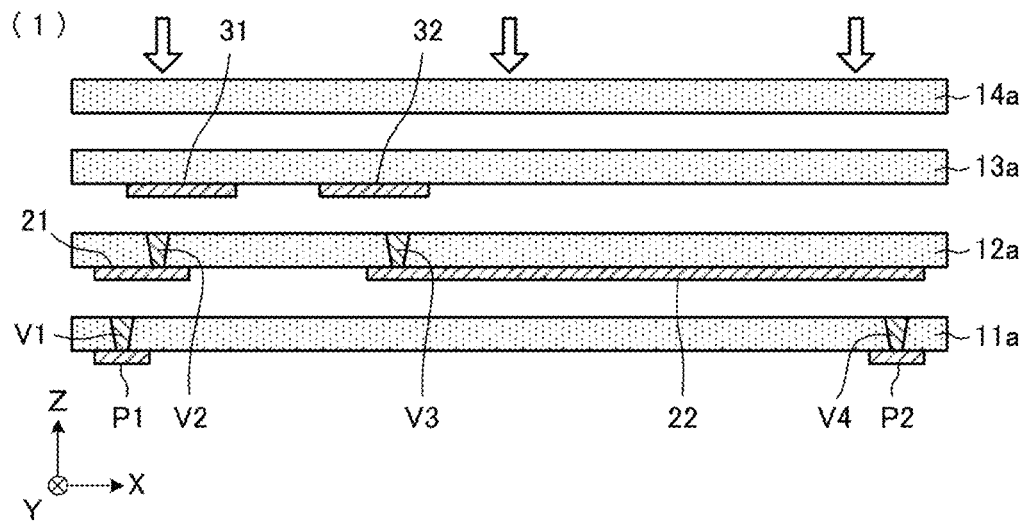
FIG. 8 is a sectional view showing a process of manufacturing the resin multilayer substrate 102 in order.
Figure 8:
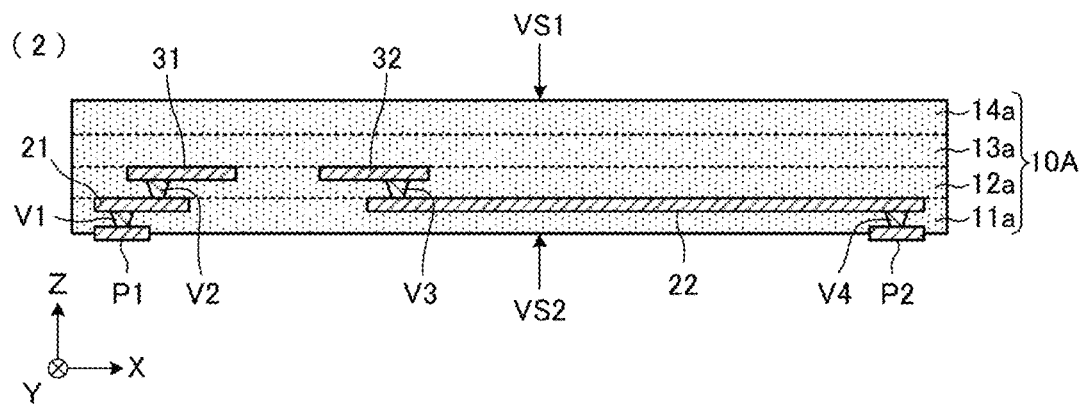
Figure 8:
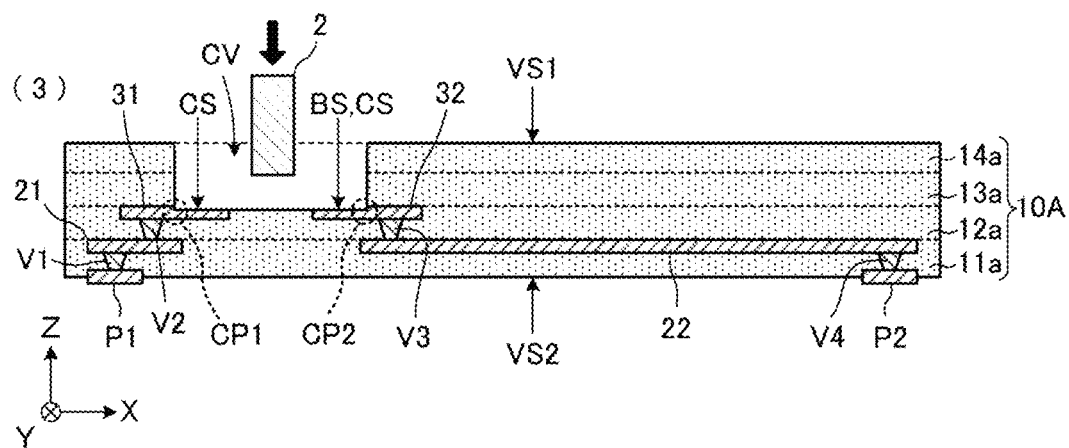
Figure 9:
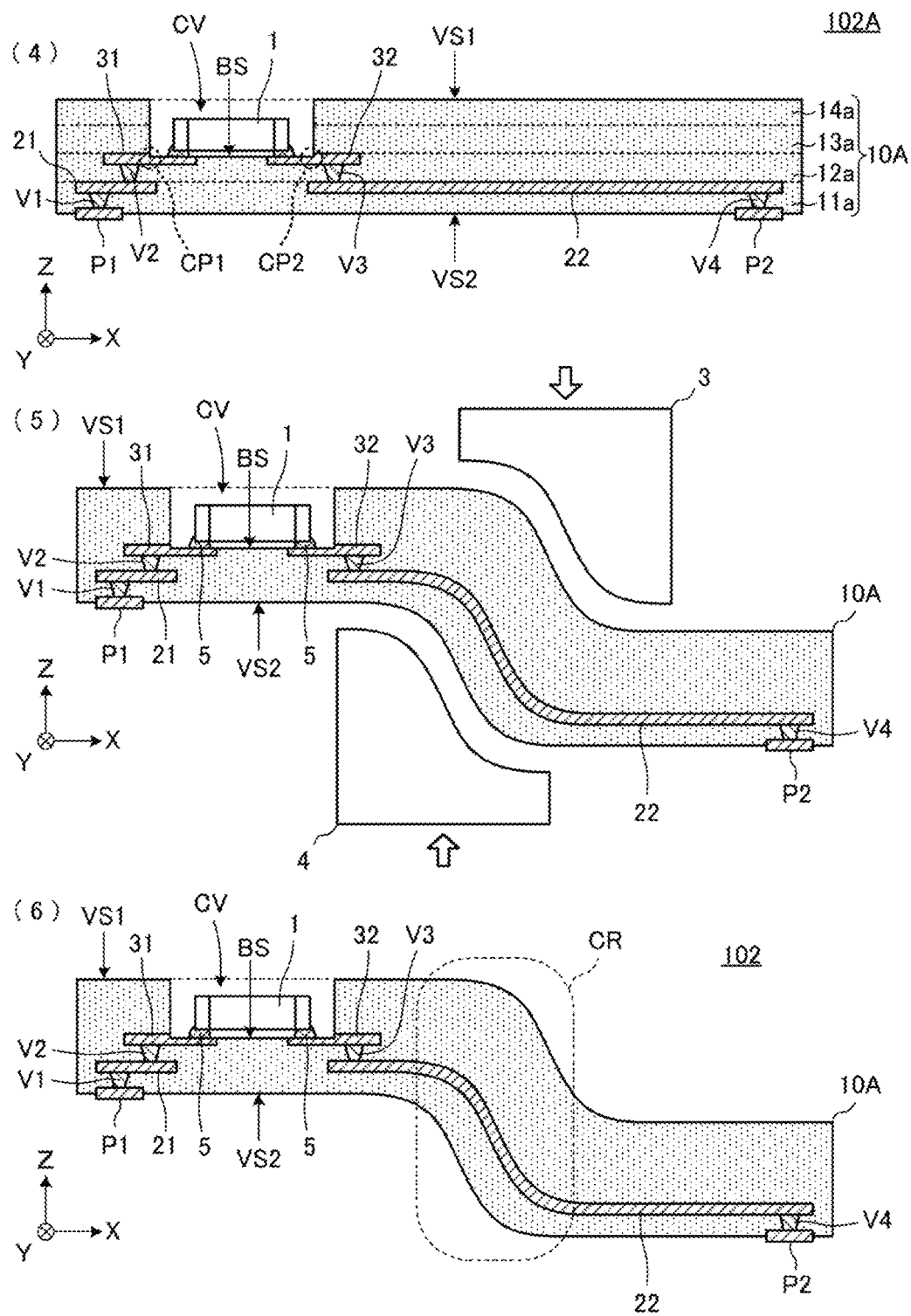
FIG. 9 is a sectional view showing the process of manufacturing the resin multilayer substrate 102 in order.

The resin multilayer substrate 102 according to the present preferred embodiment is manufactured by, for example, the following non-limiting example of a process. FIGS. 8 and 9 are sectional views showing the process of manufacturing the resin multilayer substrate 102 in order. For convenience of explanation, the manufacturing process using one chip (individual piece) will be described in FIG. 8, but the actual manufacturing process of the resin multilayer substrate is performed in a state of a collective board.

First, as shown in (1) in FIG. 8, the plurality of insulating substrate layers 11a, 12a, 13a, and 14a are prepared.

After that, the conductor patterns 21, 22, 31, and 32, the external electrodes P1 and P2, and the like are formed on the plurality of insulating substrate layers 11a, 12a, and 13a. Specifically, a metal foil (for example, Cu foil) is laminated on one surface of each of the insulating substrate layers 11a, 12a, and 13a, and the metal foil is patterned by photolithography, for example. As a result, the external electrodes P1 and P2 are formed on a reverse surface of the insulating substrate layer 11a, the conductor patterns 21 and 22 are formed on a reverse surface of the insulating substrate layer 12a, and the conductor patterns 31 and 32 are formed on a reverse surface of the insulating substrate layer 13a.

Further, the interlayer connection conductors V1 and V4 are formed on the insulating substrate layer 11a, and the interlayer connection conductors V2 and V3 are formed on the insulating substrate layer 12a.

Next, the insulating substrate layers 11a, 12a, 13a, and 14a are stacked in order, and the plurality of stacked insulating substrate layers 11a, 12a, 13a, and 14a are heat-pressed (collectively pressed) to form the stacked body 10A as shown in (2) in FIG. 8.

After that, as shown in (3) in FIG. 8, the cavity CV is formed by, for example, grinding and polishing the stacked body 10A from the first main surface VS1 with the cutting machine 2. Note that the thin film of the insulating substrate layers does not exist on the bottom surface BS of the cavity CV shown in (3) in FIG. 8. In this way, the conductor patterns 31 and 32 are formed on the reverse surface of the insulating substrate, the insulating substrate layers are stacked to form the stacked body, and the stacked body is ground and polished to form the cavity CV. This allows the thin film of the insulating substrate layers to be unlikely to remain after the cavity CV is formed. Therefore, compared with the case where the thin film of the insulating substrate layers remains on the bottom surface BS of the cavity CV, the interface between the insulating substrate layers is unlikely to peel off on the bottom surface BS of the cavity CV when the cavity is formed by the cutting machine 2.

Next, as shown in (4) in FIG. 9, the component 1 is mounted on the bottom surface BS of the cavity CV, and a resin multilayer substrate 102A is obtained by being separated from the collective board into individual pieces.

Then, as shown in (5) in FIG. 9, the first main surface VS1 and the second main surface VS2 of the stacked body 10A are heated and pressurized in the Z-axis direction using an upper mold 3 and a lower mold 4 (see an arrow shown in (5) in FIG. 9).

After the stacked body 10A is cooled and solidified, the stacked body 10A is removed from the upper mold 3 and the lower mold 4, and the resin multilayer substrate 102 holding a bent shape as shown in (6) in FIG. 9 is obtained.

Third Preferred Embodiment

In a third preferred embodiment of the present invention, an example of a resin multilayer substrate provided with a protective layer is shown.

Figure 10A:
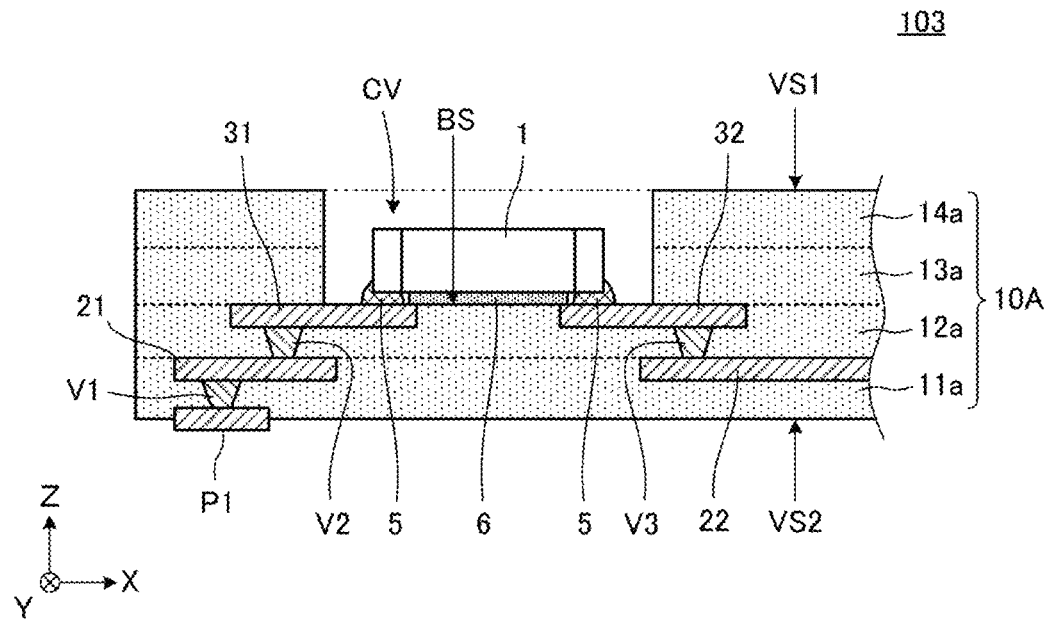
FIG. 10A is an enlarged sectional view showing a first end of a resin multilayer substrate 103 according to a third preferred embodiment of the present invention.
Figure 10B:
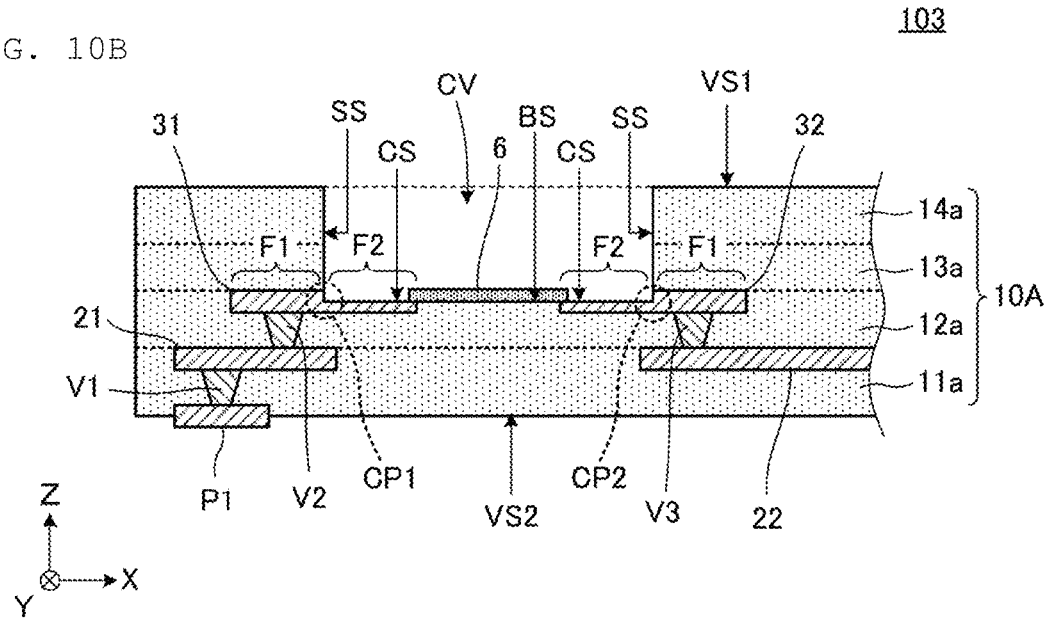
FIG. 10B is an enlarged sectional view showing the first end of the resin multilayer substrate 103 before the component is disposed in the cavity CV.

FIG. 10A is an enlarged sectional view showing a first end of a resin multilayer substrate 103 according to the third preferred embodiment, and FIG. 10B is an enlarged sectional view showing the first end of the resin multilayer substrate 103 before the component is disposed in the cavity CV.

The resin multilayer substrate 103 is different from the resin multilayer substrate 102 according to the second preferred embodiment in that a protective layer 6 is further provided. Other configurations of the resin multilayer substrate 103 are the same or substantially the same as those of the resin multilayer substrate 102.

Hereinafter, elements and portions different from the resin multilayer substrate 102 according to the second preferred embodiment will be described.

The protective layer 6 is an insulating film provided on the bottom surface BS of the cavity CV. A Young's modulus E6 of the protective layer 6 is higher than a Young's modulus E10 of the stacked body 10A (E6>E10). The protective layer 6 is preferably, for example, a coverlay film or a solder resist film.

In this way, the protective layer 6 may be provided on the bottom surface BS of the cavity CV in order to prevent a short circuit between the conductor patterns 31 and 32 due to the conductive bonding material 5 and the like. Further, in the present preferred embodiment, the protective layer 6 having a higher Young's modulus than the stacked body 10A is provided on the bottom surface BS of the cavity CV, and thus the cavity CV can be less likely to be deformed even when bending stress occurs in the stacked body 10A.

Fourth Preferred Embodiment

A fourth preferred embodiment of the present invention shows an example in which the shape of the conductor patterns is different from that of the above preferred embodiments.

Figure 11:
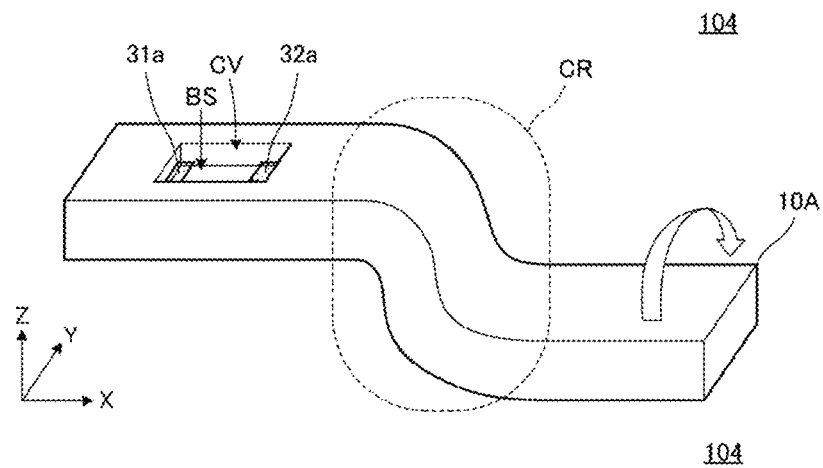
FIG. 11 is an external perspective view of a resin multilayer substrate 104 according to a fourth preferred embodiment of the present invention.
Figure 12:
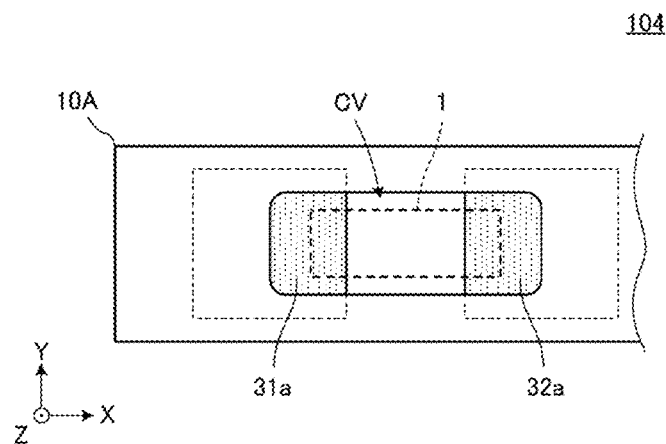
FIG. 12 is an enlarged plan view showing a first end of the resin multilayer substrate 104.

FIG. 11 is an external perspective view of a resin multilayer substrate 104 according to the fourth preferred embodiment. FIG. 12 is an enlarged plan view showing a first end of the resin multilayer substrate 104. In FIG. 12, the component 1 is shown by a broken line to make the structure easy to understand.

The resin multilayer substrate 104 is different from the resin multilayer substrate 101 according to the first preferred embodiment in that the conductor patterns 31a and 32a are provided. Other configurations of the resin multilayer substrate 104 are the same or substantially the same as those of the resin multilayer substrate 101.

Hereinafter, elements and portions different from the resin multilayer substrate 101 according to the first preferred embodiment will be described.

The conductor patterns 31a and 32a have a square planar shape, and have a larger area than the conductor patterns 31 and 32 described in the first preferred embodiment.

As shown in FIG. 12, the conductor patterns 31a and 32a are disposed at least at four corners of the bottom surface of the cavity CV when viewed from the Z-axis direction.

The resin multilayer substrate 104 according to the present preferred embodiment achieves the following advantageous effects in addition to the advantageous effects described in the first preferred embodiment.

When bending or an external force is applied to the stacked body, the bending stress tends to concentrate at the corners of the cavity. Meanwhile, in the present preferred embodiment, the conductor patterns 31a and 32a, disposed at least at the corners of the bottom surface of the cavity CV, prevent tearing at the corners of the bottom surface of the cavity CV on which the bending stress tends to concentrate when the resin multilayer substrate 104 (stacked body 10A) is twisted (see white arrow shown in FIG. 11).

Figure 13:
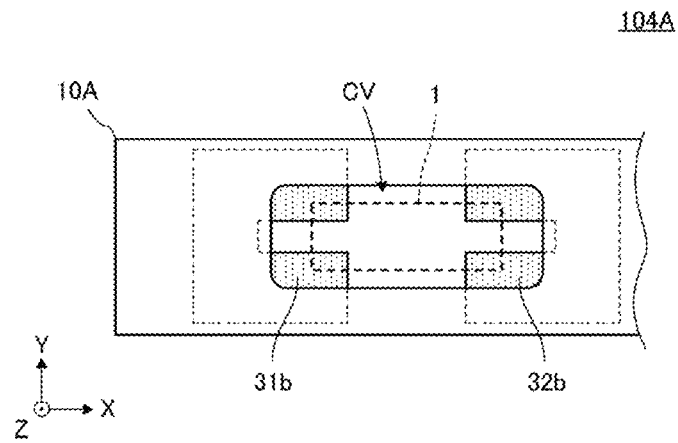
FIG. 13 is an enlarged plan view showing a first end of a resin multilayer substrate 104A of a modification of a preferred embodiment of the present invention.

The conductor patterns of preferred embodiments of the present invention may have the following configuration. FIG. 13 is an enlarged plan view showing a first end of a resin multilayer substrate 104A of a modification of a preferred embodiment of the present invention. In FIG. 13, the component 1 is shown by a broken line to make the structure easy to understand.

The resin multilayer substrate 104A is different from the resin multilayer substrate 104 in that the conductor patterns 31b and 32b are provided. Other configurations of the resin multilayer substrate 104A are the same or substantially the same as those of the resin multilayer substrate 104.

The conductor patterns 31b and 32b have a C-shaped plane shape. As shown in FIG. 13, the conductor patterns 31b and 32b are disposed at four corners of the bottom surface of the cavity CV when viewed from the Z-axis direction.

This configuration achieves similar advantageous effects to the advantageous effects of the resin multilayer substrate 104.

However, the resin multilayer substrate 104 is preferable in terms of reducing or preventing the occurrence of cracks at the boundary between the side surfaces and the bottom surface of the cavity.

In the present preferred embodiment, an example is shown in which the bottom surface of the cavity CV is rectangular or substantially rectangular and the conductor patterns are disposed at the four corners, but the present invention is not limited to this configuration. The bottom surface of the cavity CV may be a polygon other than a rectangle, or the conductor patterns may be disposed at some of a plurality of the corners.

Fifth Preferred Embodiment

In a fifth preferred embodiment of the present invention, an example of a resin multilayer substrate in which the component is not mounted on the bottom surface of the cavity is shown.

Figure 14A:
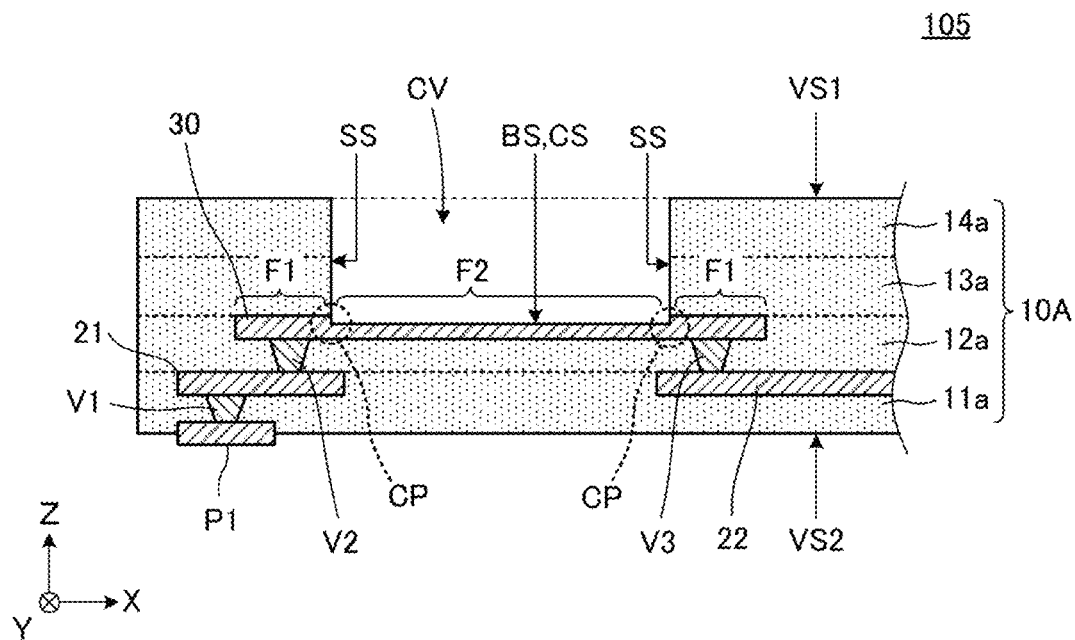
FIG. 14A is an enlarged sectional view showing a first end of a resin multilayer substrate 105 according to a fifth preferred embodiment of the present invention.
Figure 14B:
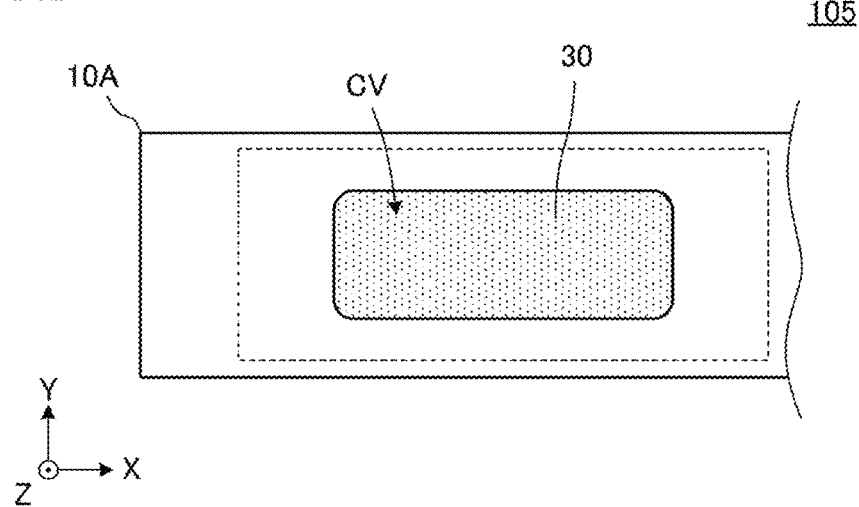
FIG. 14B is an enlarged plan view showing the first end of the resin multilayer substrate 105.

FIG. 14A is an enlarged sectional view showing a first end of a resin multilayer substrate 105 according to the fifth preferred embodiment, and FIG. 14B is an enlarged plan view showing the first end of the resin multilayer substrate 105.

The resin multilayer substrate 105 is different from the resin multilayer substrate 102 according to the second preferred embodiment in that the conductor pattern 30 is provided. Other configurations of the resin multilayer substrate 105 are the same or substantially the same as those of the resin multilayer substrate 102.

Hereinafter, elements and portions different from the resin multilayer substrate 102 according to the second preferred embodiment will be described.

The conductor pattern 30 has a rectangular or substantially rectangular planar shape. The conductor pattern 30 overlaps the entire or substantially the entire cavity CV when viewed from the Z-axis direction. In other words, the conductor pattern 30 is provided over all of the bottom surface BS of the cavity CV. In the present preferred embodiment, the entire or substantially the entire boundary (portion CP) between the side surfaces SS and the bottom surface BS of the cavity CV includes the conductor pattern 30 continuous with the side surfaces SS and the bottom surface BS.

The resin multilayer substrate 105 according to the present preferred embodiment is used, for example, as follows.

Figure 15:
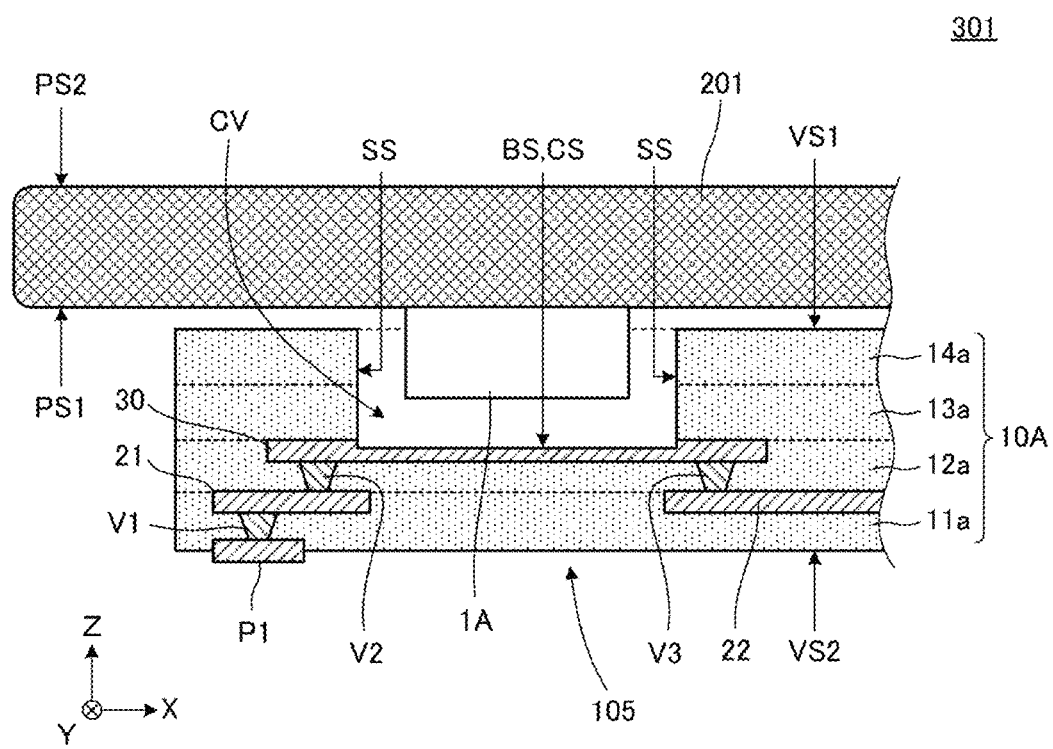
FIG. 15 is a sectional view showing a main portion of an electronic device 301 according to the fifth preferred embodiment of the present invention.

FIG. 15 is a sectional view showing a main part of an electronic device 301 according to the fifth preferred embodiment.

The electronic device 301 includes the resin multilayer substrate 105, a circuit board 201, a component 1A, and the like. The component 1A is mounted on a first surface PS1 of the circuit board 201. The electronic device 301 has a configuration other than the above, which is not shown in FIG. 15. The circuit board 201 is, for example, a glass/epoxy board.

The resin multilayer substrate 105 and the circuit board 201 are disposed close to each other with a portion of the component 1A disposed in the cavity CV. As shown in FIG. 15, the first main surface VS1 of the stacked body 10A included in the resin multilayer substrate 105 is parallel or substantially parallel to the first surface PS1 of the circuit board 201. Further, the conductor pattern 30 is not conductive to the component 1A. Although not shown, the conductor pattern 30 is connected to a ground.

As shown in the present preferred embodiment, in order to avoid the component 1A and the like mounted on the circuit board disposed in proximity, the component 1A and the like may be disposed in the cavity CV. In this configuration, noise generated from the component 1A mounted on the circuit board 201 is shielded by the conductor pattern 30, and thus an influence of the noise from the component 1A on the resin multilayer substrate 105 can be reduced or prevented. Further, in this configuration, because the noise generated from the resin multilayer substrate 105 is shielded by the conductor pattern 30, the influence of the noise from the resin multilayer substrate 105 on the circuit board 201 and the component 1A can be reduced or prevented.

Further, in the present preferred embodiment, the conductor pattern 30 connected to the ground is preferably provided over all of the bottom surface BS of the cavity CV. In other words, the conductor pattern 30 preferably overlaps the entire or substantially the entire cavity CV when viewed from the Z-axis direction. This configuration can further improve the noise shielding effect as compared with a case where the conductor pattern 30 is provided at a portion of the bottom surface BS.

In the present preferred embodiment, the entire or substantially the entire boundary (portion CP) between the side surfaces SS and the bottom surface BS of the cavity CV includes the conductor pattern 30 continuous with the side surfaces SS and the bottom surface BS. This configuration can further reduce or prevent the occurrence of cracks in the cavity CV due to the bending stress as compared with the case where a portion of the boundary between the side surfaces SS and the bottom surface BS of the cavity CV includes the conductor patterns.

Sixth Preferred Embodiment

In a sixth preferred embodiment of the present invention, an example of an electronic device different from the electronic device 301 according to the fifth preferred embodiment is shown.

Figure 16A:
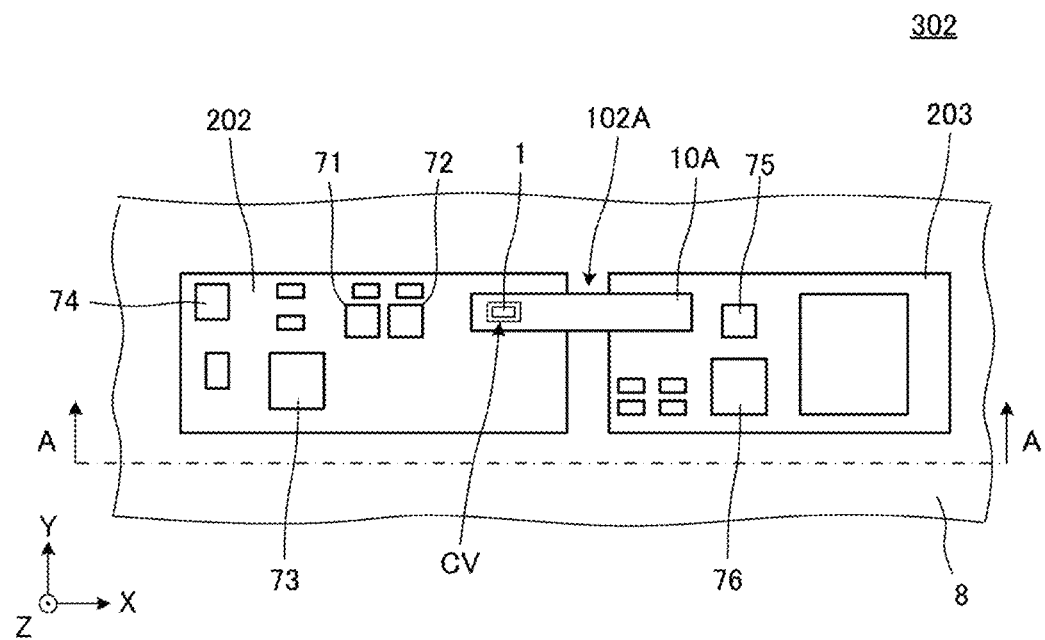
FIG. 16A is a plan view showing a main portion of an electronic device 302 according to a sixth preferred embodiment of the present invention.
Figure 16B:
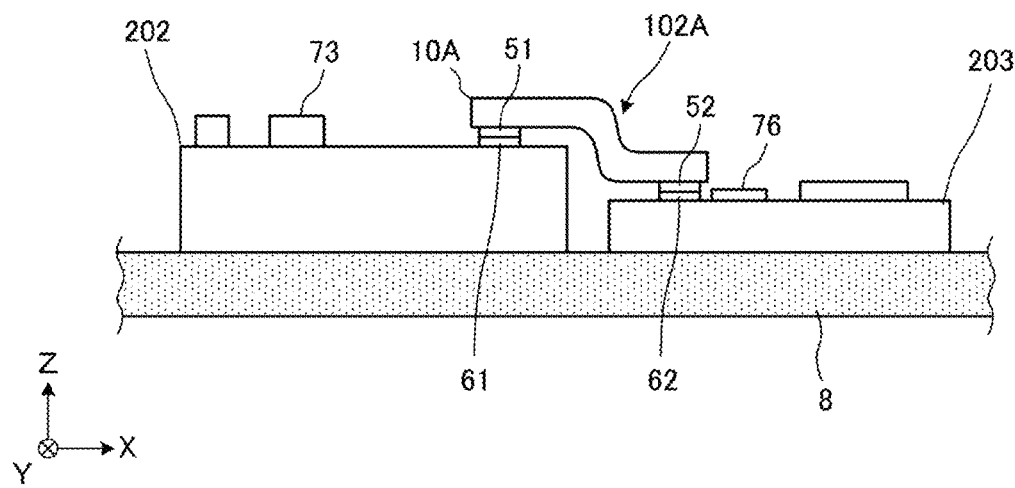
FIG. 16B is a sectional view taken along line A-A in FIG. 16A.

FIG. 16A is a plan view showing a main portion of an electronic device 302 according to the sixth preferred embodiment, and FIG. 16B is a sectional view taken along line A-A in FIG. 16A.

The electronic device 302 includes a housing 8, circuit boards 202 and 203, the resin multilayer substrate 102A, electronic components 71, 72, 73, 74, 75, and 76 and the like. The resin multilayer substrate 102A is the same or substantially the same as the resin multilayer substrate 102 described in the second preferred embodiment except that the resin multilayer substrate 102A includes plugs 51 and 52. The electronic device 302 includes a configuration other than the above, which is not shown in FIGS. 16A and 16B. The circuit boards 202 and 203 are preferably, for example, printed wiring boards.

The circuit boards 202 and 203, the resin multilayer substrate 102A, and the electronic components 71 to 76 are accommodated in the housing 8. A main surface of the circuit board 202 and a main surface of the circuit board 203 are both parallel or substantially parallel to an XY plane and have different heights in the Z-axis direction. The electronic components 71, 72, 73, and 74 and the like are mounted on a surface of the circuit board 202. The electronic components 75 and 76 and the like are mounted on a surface of the circuit board 203. The electronic components 71 to 76 are preferably, for example, semiconductor devices, chip components such as chip inductors or chip capacitors, RFIC elements, impedance matching circuits, or the like.

The circuit board 202 and the circuit board 203 are connected with a resin multilayer substrate 102A interposed therebetween. Specifically, the plug 51 of the resin multilayer substrate 102A is connected to a receptacle 61 disposed on the surface of the circuit board 202. Further, the plug 52 of the resin multilayer substrate 102A is connected to a receptacle 62 disposed on the surface of the circuit board 203.

As described above, the resin multilayer substrate 102A (stacked body 10A) includes the bent portion CR, which makes it possible to easily connect the circuit boards 202 and 203 having different heights in the Z-axis direction of the main surface.

In the present preferred embodiment, an example is shown in which the resin multilayer substrate and the circuit board are connected by a connector (plug and receptacle), but the present invention is not limited to this configuration. The resin multilayer substrate and the circuit board may be connected by using a conductive bonding material such as solder.

In the above-described preferred embodiments, an example is shown in which the stacked body is a rectangular or substantially rectangular flat plate, but the present invention is not limited to this configuration. The planar shape of the stacked body can be appropriately changed as long as the advantageous effects of the present invention are obtained, and may be, for example, polygonal, circular, elliptical, crank-shaped, T-shaped, Y-shaped, or the like.

In the above-described preferred embodiments, an example of the stacked body formed by stacking four or five insulating substrate layers is shown, but the present invention is not limited to this configuration. The number of layers of the insulating substrate layers of the stacked body can be appropriately changed within the range in which the advantageous effects of the present invention are obtained. Further, a protective layer such as a coverlay film or a solder resist film may be provided on the first main surface VS1 or the second main surface VS2 of the stacked body.

Further, in the above-described preferred embodiments, an example of a stacked body formed by stacking the plurality of insulating substrate layers including a thermoplastic resin is shown, but the present invention is not limited to this configuration. The stacked body may be formed by stacking the plurality of insulating substrate layers including, for example, a thermosetting resin.

In the above-described preferred embodiments, an example is shown in which the cavity CV is a rectangular or substantially rectangular parallelepiped recess, but the present invention is not limited to this configuration. The cavity CV may be, for example, a polygonal prism or a cylinder. Further, the planar shape of the bottom surface of the cavity CV is not limited to a rectangle, and may be, for example, a polygon, a circle, an ellipse, or the like. Further, the cavity CV may be a groove that partially extends to an end surface of the stacked body 10.

Further, in the above-described preferred embodiments, an example is shown in which the component 1 is connected to the conductor patterns 31 and 32 provided at the bottom surface BS of the cavity CV with the conductive bonding material 5 interposed therebetween, but the present invention is not limited to this configuration. The component 1 may be connected to the conductor patterns 31 and 32 with an insulating anisotropic conductive film (ACF) interposed therebetween. The insulating anisotropic conductive film is a member that exhibits conductivity at a portion where a pressure equal to or higher than a predetermined pressure is applied during heating and pressurizing. Fine conductive particles are dispersed on a semi-cured prepreg resin sheet, and this prepreg resin sheet is molded into a film to form the insulating anisotropic conductive film.

Further, in the above-described preferred embodiments, an example is shown in which the planar shape of the conductor patterns is rectangular, substantially rectangular, or C-shaped, but the present invention is not limited to this configuration. The planar shape of the conductor patterns can be appropriately changed within a range in which the advantageous effects of the present invention are obtained, and may be, for example, polygonal, circular, oval, L-shaped, T-shaped, crank-shaped, or the like.

Further, a circuit configuration provided on the resin multilayer substrate is not limited to the configurations of the above-described preferred embodiments. A circuit provided on the resin multilayer substrate can be appropriately changed within the range in which the advantageous effects of the present invention are obtained, and may include, for example, a coil including a conductor pattern, a capacitor defined by a conductor pattern, and the like. Further, various transmission lines (strip line, microstrip line, meander, coplanar, or the like) and the like may be provided on the resin multilayer substrate. Further, electronic components other than the components 1 and 1A may be mounted on the resin multilayer substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
   a stacked body including a first main surface and a plurality of insulating substrate layers that are stacked and include thermoplastic resin as a main material;
   a cavity disposed in the first main surface and including a side surface and a bottom surface; and
   a conductor pattern disposed in the stacked body; wherein
   the stacked body includes a bent portion;
   all of the plurality of insulating substrate layers of the stacked body included in the bent portion include a main material that is the same as at least one main material of all of the plurality of insulating substrate layers of the stacked body included outside of the bent portion;
   the cavity and the bent portion are spaced apart from one another; and
   at least a portion of a boundary between the side surface and the bottom surface includes the conductor pattern continuous with the side surface and the bottom surface.

2. The resin multilayer substrate according to claim 1, wherein
   the stacked body includes a second main surface opposing the first main surface; and
   the stacked body has a thickness from the bottom surface to the second main surface in a stacking direction of the plurality of insulating substrate layers, the thickness being less than a thickness of the stacked body from the first main surface to the bottom surface in the stacking direction.

3. The resin multilayer substrate according to claim 1, further comprising:
   an interlayer connection conductor disposed in the stacked body; wherein
   the interlayer connection conductor does not overlap the cavity when viewed from the stacking direction of the plurality of insulating substrate layers.

4. The resin multilayer substrate according to claim 1, wherein
   the conductor pattern includes a first region embedded in the stacked body and a second region at least partially exposed on the bottom surface; and
   the second region has a thickness greater than one-half of a thickness of the first region.

5. The resin multilayer substrate according to claim 1, wherein a portion of the boundary between the side surface and the bottom surface and closest to the bent portion includes the conductor pattern continuous with the side surface and the bottom surface.

6. The resin multilayer substrate according to claim 1, wherein
   the bottom surface is polygonal when viewed from a stacking direction of the plurality of insulating substrate layers; and
   the conductor pattern is disposed at least at a corner of the bottom surface when viewed from the stacking direction.

7. The resin multilayer substrate according to claim 1, wherein an entirety or substantially an entirety of the boundary includes the conductor pattern continuous with the side surface and the bottom surface.

8. The resin multilayer substrate according to claim 1, wherein an entirety or substantially an entirety of the conductor pattern is disposed at the bottom surface when viewed from a stacking direction of the plurality of insulating substrate layers.

9. The resin multilayer substrate according to claim 1, further comprising:
- a component at least partially disposed in the cavity; wherein
- the component is conductive to the conductor pattern.

10. The resin multilayer substrate according to claim 9, wherein
- the conductor pattern includes a first region embedded in the stacked body and a second region at least partially exposed on the bottom surface; and
- the second region includes a surface exposed on the bottom surface and having a surface roughness that is smaller than a surface roughness of a surface of the first region.

11. The resin multilayer substrate according to claim 1, wherein
- the stacked body includes an external electrode on a second main surface opposing the first main surface, and at least one interlayer connection conductor connecting the conductor pattern and the external electrode; and
- the cavity does not overlap the at least one interlayer connection conductor.

12. The resin multilayer substrate according to claim 1, wherein the stacked body including the bent portion has a uniform or substantially uniform thickness except for the cavity.

13. The resin multilayer substrate according to claim 1, wherein
- the stacked body including the bent portion has a uniform or substantially uniform thickness except for the cavity.

14. The resin multilayer substrate according to claim 1, wherein a thickness of a portion of the stacked body included in the bent portion is greater than a thickness of a portion of the stacked body that includes the cavity.

* * * * *